(12) United States Patent
Naiki

(10) Patent No.: US 10,784,909 B2
(45) Date of Patent: Sep. 22, 2020

(54) RECEIVER AND NON-TRANSITORY COMPUTER READABLE MEDIUM STORING PROGRAM

(71) Applicant: JVC KENWOOD Corporation, Yokohama-shi, Kanagawa (JP)

(72) Inventor: Yasunori Naiki, Yokohama (JP)

(73) Assignee: JVCKENWOOD Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 16/355,287

(22) Filed: Mar. 15, 2019

(65) Prior Publication Data

US 2019/0296782 A1   Sep. 26, 2019

(30) Foreign Application Priority Data

Mar. 23, 2018   (JP) ................................. 2018-056688

(51) Int. Cl.
*H04B 1/12* (2006.01)
*H03G 3/30* (2006.01)
*H04B 1/10* (2006.01)

(52) U.S. Cl.
CPC .............. *H04B 1/12* (2013.01); *H03G 3/3052* (2013.01); *H04B 1/1018* (2013.01); *H04B 1/1027* (2013.01)

(58) Field of Classification Search
CPC ...... H04B 1/12; H04B 1/1027; H04B 1/1018; H04B 1/1036; H04B 1/123; H03G 3/3052; H03G 2201/305; H03G 3/345

See application file for complete search history.

(56) References Cited

U.S. PATENT DOCUMENTS

| 4,189,679 A | * | 2/1980 | Amazawa | ............... | H03G 3/345 |
| | | | | | 455/224 |
| 2009/0010453 A1 | * | 1/2009 | Zurek | ................. | G10L 21/0208 |
| | | | | | 381/94.5 |
| 2016/0191007 A1 | * | 6/2016 | Li | .......................... | H03G 9/005 |
| | | | | | 381/107 |

FOREIGN PATENT DOCUMENTS

JP   2013074567 A   4/2013

* cited by examiner

*Primary Examiner* — Sam K Ahn
*Assistant Examiner* — Amneet Singh
(74) *Attorney, Agent, or Firm* — Procopio, Cory, Hargreaves & Savitch LLP

(57) ABSTRACT

A receiver and a program capable of, when they have received a pulse noise together with a reception signal, improving quality of the reception signal are provided. A receiver according to the present disclosure includes a received-signal amplification circuit configured to amplify a monitoring received signal branched from a received signal, a gain control circuit configured to set a gain setting value for an AGC operation in the received-signal amplification circuit, the AGC operation being an operation for making an amplitude of an amplified monitoring received signal fall within a predetermined range, a pulse detection circuit configured to monitor a change in the gain setting value and detect whether or not a pulse noise is contained in the received signal based on whether or not the change in the gain setting value meets a predetermined condition.

4 Claims, 6 Drawing Sheets

RECEIVER AND NON-TRANSITORY COMPUTER READABLE MEDIUM STORING PROGRAM

CROSS REFERENCE TO RELATED APPLICATION

This application is based upon and claims the benefit of priority from Japanese patent application No. 2018-056688, filed on Mar. 23, 2018, the disclosure of which is incorporated herein in its entirety by reference.

BACKGROUND

The present disclosure relates to a receiver and a program. In particular, the present disclosure relates to a receiver and a program capable of, when they have received a pulse noise together with a reception signal, improving quality of the reception signal.

A receiver that converts a received signal into a signal in an IF (Intermediate Frequency) band and amplifies the obtained IF signal in the IF band has been known. The receiver amplifies the IF signal in an amplification unit and the amplification unit has an IF-AGC (Automatic Gain Control) function of automatically controlling its gain.

Japanese Unexamined Patent Application Publication No. 2013-74567 discloses that a peak curve based on peaks of a modulated wave of an input signal is derived as a threshold reference curve, which is used as a reference for a threshold, and a threshold curve is derived by adding a predetermined offset value to the threshold reference curve. Further, Japanese Unexamined Patent Application Publication No. 2013-74567 discloses that an attenuation characteristic line is derived based on the derived threshold curve in such a manner that when the input signal is smaller than the threshold curve, it is not attenuated, whereas when the input signal is equal to or larger than the threshold, it is gradually decreased in accordance with an increase in the input signal. Further, Japanese Unexamined Patent Application Publication No. 2013-74567 discloses a noise blanker that attenuates the input signal based on the attenuation characteristic line. Japanese Unexamined Patent Application Publication No. 2013-74567 does not disclose any method for, when a receiver having an IF-AGC function for a monitoring IF signal branched from an IF signal receives a pulse noise together with an IF signal, preventing intelligibility of the IF signal from deteriorating.

SUMMARY

A receiver having an IF-AGC function may receive a pulse noise, which could be caused by, for example, a switching operation of an electric lamp, together with a reception signal. In such cases, the receiver having the IF-AGC function controls its gain according to the pulse noise having an amplitude larger than that of the reception signal. As a result, the amplitude of the reception signal, which is smaller than that of the pulse noise, decreases. Consequently, the intelligibility of the reception signal deteriorates or voices (or sounds) become inaudible. As described above, there is a problem that when the receiver having the IF-AGC function receives a pulse noise together with a reception signal, quality of the reception signal deteriorates. An object of an embodiment is to provide a receiver and a program capable of, when they have received a pulse noise together with a reception signal, improving quality of the reception signal.

Accordingly, an embodiment provides a receiver including:
a received-signal amplification circuit configured to amplify a monitoring received signal branched from a received signal;
a gain control circuit configured to set a gain setting value for an AGC operation in the received-signal amplification circuit, the AGC operation being an operation for making an amplitude of an amplified monitoring received signal fall within a predetermined range;
a pulse detection circuit configured to monitor a change in the gain setting value and detect whether or not a pulse noise is contained in the received signal based on whether or not the change in the gain setting value meets a predetermined condition; and
a pulse noise removal circuit configured to attenuate the received signal by a predetermined attenuation amount for a predetermined period when it is detected that the pulse noise is contained in the received signal.

Further, another embodiment provides a non-transitory computer readable medium storing a program for causing a computer to:
set a gain setting value in a received-signal amplification circuit so that an amplitude of an amplified monitoring received signal amplified by the received-signal amplification circuit falls within a predetermined range, the monitoring received signal being a signal branched from a received signal;
detect that a pulse noise is contained in the received signal when a period that is required for a change in the gain setting value is shorter than a predetermined period threshold and a quantity of the change is larger than a predetermined variation threshold; and
attenuate the received signal by a predetermined attenuation amount only for a predetermined period when it is detected that the pulse noise is contained in the received signal.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiment

Embodiments will be described hereinafter with reference to the drawings.

Firstly, an outline of a receiver according to an embodiment is described.

Figure 1:
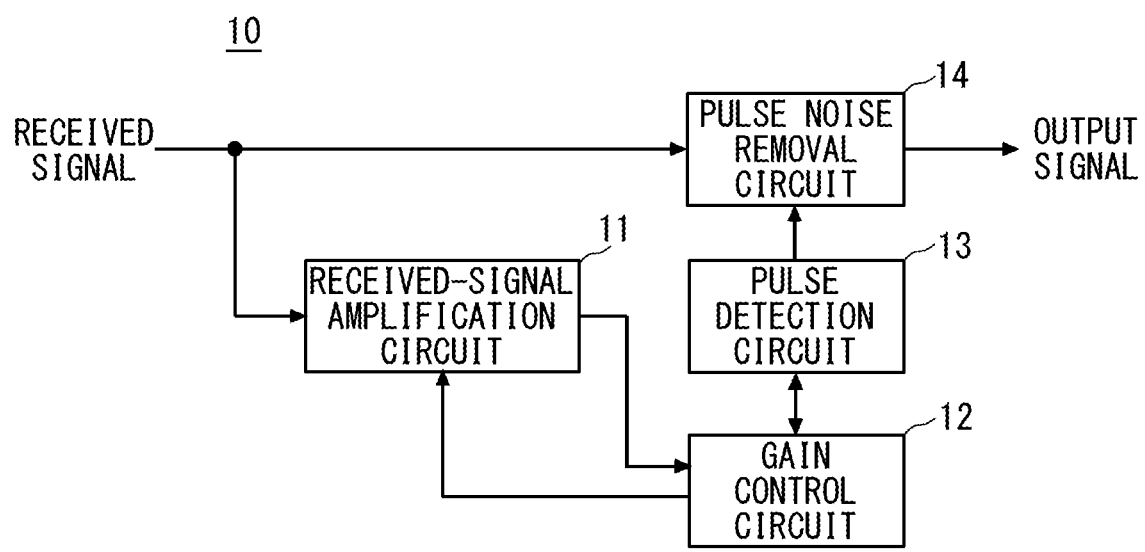
FIG. 1 is a block diagram showing an example of a receiver according to an embodiment.

FIG. 1 is a block diagram showing an example of a receiver 10 according to an embodiment.

As shown in FIG. 1, a receiver 10 according to an embodiment includes a received-signal amplification circuit 11, a gain control circuit 12, a pulse detection circuit 13, and a pulse noise removal circuit 14.

The received-signal amplification circuit 11 amplifies a monitoring received signal branched from a received signal.

The gain control circuit 12 sets a gain setting value in the received-signal amplification circuit 11 so that the amplitude of the amplified monitoring received signal falls within a predetermined range. The received-signal amplification circuit 11 amplifies the monitoring received signal based on the gain setting value.

The pulse detection circuit 13 detects that a pulse noise is contained in the received signal when a period during which a change in the gain setting value is larger than a predetermined variation threshold is shorter than a predetermined period threshold.

The pulse noise removal circuit 14 attenuates, when it is detected that a pulse noise is contained in the received signal, an amplitude of the received signal by a predetermined attenuation amount Da only for a blanking period Tb that starts upon the occurrence of the pulse noise. The blanking period Tb is, for example, a period during which a pulse noise is detected.

The above-described function of setting a gain setting value in the received-signal amplification circuit 11 so that the amplitude of the monitoring received signal amplified by the received-signal amplification circuit 11 falls within the predetermined range is referred to as an AGC function. The AGC function for an IF (Intermediate Frequency) signal in an IF band is referred to as an IF-AGC function. The receiver 10 has this IF-AGC function. When the receiver 10 needs to be equipped with an IF-AGC function for an IF signal, a received-signal amplification circuit having an IF-AGC function (not shown) may be provided on the output side of the pulse noise removal circuit 14.

The IF-AGC function is described hereinafter.

The IF-AGC function is a function to control an AGC voltage that is set in the received-signal amplification circuit 11 in order to make an amplitude of a signal amplified by the received-signal amplification circuit 11 fall within a predetermined range. When the AGC voltage is increased, a gain of the received-signal amplification circuit 11 increases and hence an amplitude of an output signal output from the received-signal amplification circuit 11 increases. When the AGC voltage is decreased, the gain of the received-signal amplification circuit 11 decreases and hence the amplitude of the output signal output from the received-signal amplification circuit 11 decreases.

The IF-AGC function rectifies and smooths a part of the output signal, and thereby converts it into a signal value corresponding to the amplitude of the output signal (e.g., converts it into a DC (Direct Current) potential). When the obtained signal value is compared with a predetermined reference value (a predetermined reference level) and the signal value is larger than the predetermined reference value, the gain of the received-signal amplification circuit 11 is decreased and controlled so that the amplitude of the output signal falls within the predetermined range.

An IF-AGC function that is performed when the receiver 10 receives a pulse noise is described hereinafter.

A pulse noise is a noise signal that has a large amplitude in a short period, i.e., a period up to several milliseconds. When a receiver 10 having an IF-AGC function receives such a pulse noise, it performs an operation for decreasing an AGC voltage and thereby decreasing a gain of a received-signal amplification circuit 11 in order to make the amplitude of the pulse noise equal to or higher than the reference value (the reference level) fall within the predetermined range. The above-described operation is referred to as an attack operation. In the attack operation, in order to make the amplitude of the pulse noise fall within the predetermined range, the gain of the received-signal amplification circuit 11 is decreased by, for example, decreasing the AGC voltage over a period of about two milliseconds.

Then, after the pulse noise has passed (i.e., has disappeared), there is no pulse noise. As a result, the amplitude of the signal input to the received-signal amplification circuit 11 decreases. Therefore, in order to recover (i.e., raise) the gain of the received-signal amplification circuit 11, which has been decreased until then, the receiver 10 performs an operation for increasing the AGC voltage and thereby increasing the gain of the received-signal amplification circuit 11. The above-described operation is referred to as a release operation. In the release operation, the gain of the received-signal amplification circuit 11 is recovered by, for example, increasing the AGC voltage over a period of about 100 milliseconds to 10 seconds.

Further, in the case where the receiver 10 receives a pulse noise together with a reception signal (i.e., where a pulse noise is contained in a reception signal), every time the pulse noise is input to the receiver 10, the gain of the received-signal amplification circuit 11 is decreased by the attack operation. As a result, the amplitude of the target reception signal decreases during the release operation. For the monitoring received signal, the release operation which is performed to demodulate a voice signal (or a sound signal) may be unnecessary. Therefore, it is desired that its release time is sufficiently shorter than the cycle of the pulse noise.

Therefore, the receiver 10 according to the embodiment attenuates, when it is detected that a pulse noise is contained in the received signal, the amplitude of the received signal by the predetermined attenuation amount Da only for the blanking period Tb that starts upon the occurrence of the pulse noise. The blanking period Tb is, for example, a period during which a pulse noise is detected. Further, the receiver 10 does not attenuate the amplitude of the received signal outside the blanking period Tb. In this way, the receiver 10 suppresses and removes pulse noises and hence can receive the target reception signal.

Next, details of the receiver according to the embodiment are described.

Figure 2:
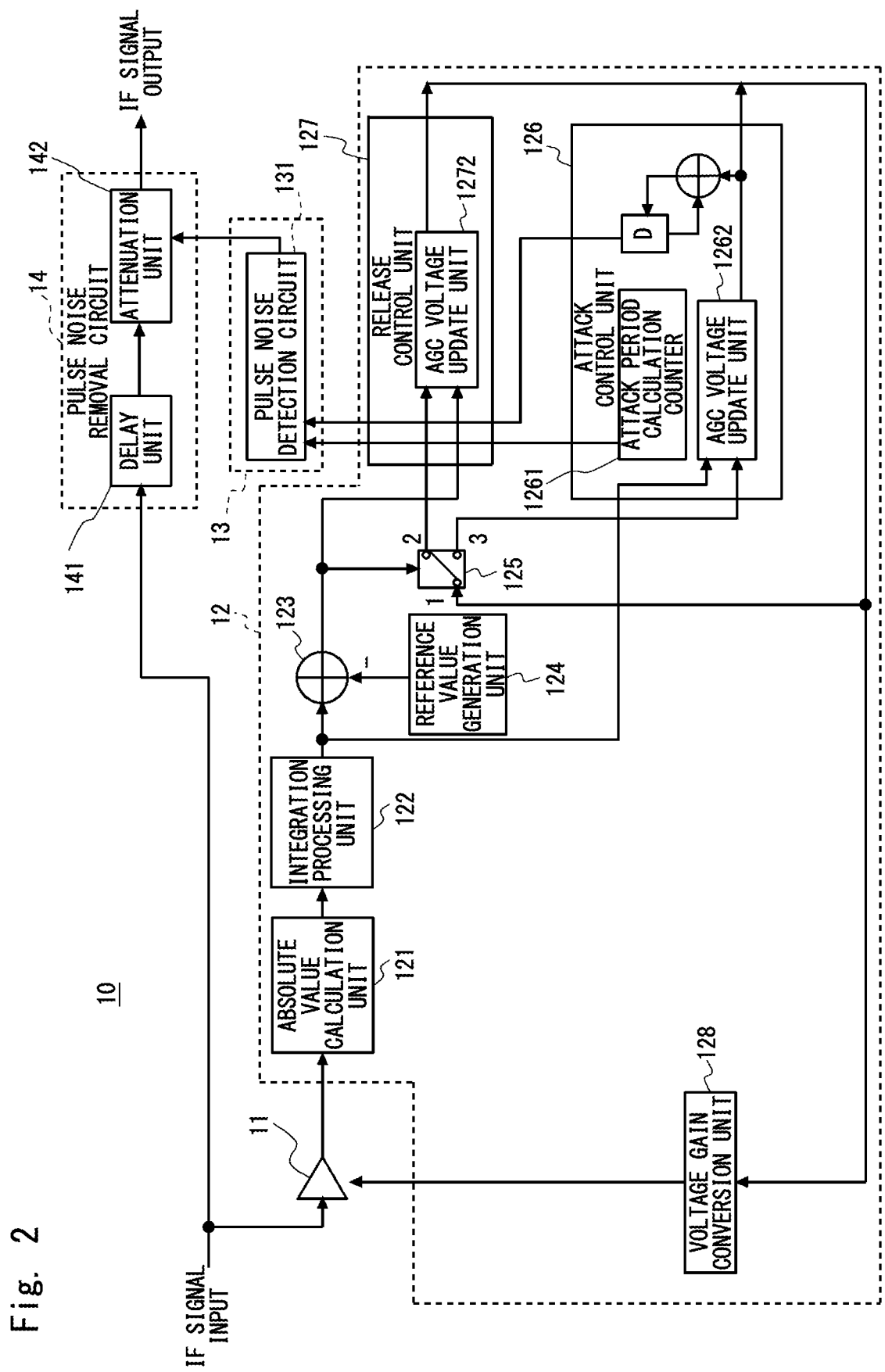
FIG. 2 is a block diagram showing an example of a receiver according to an embodiment.

FIG. 2 is a block diagram showing an example of a receiver according to an embodiment.

In FIG. 2, a received signal is converted into an IF (Intermediate Frequency) signal in an IF band, and details of the receiver are described by using the obtained IF signal as an example. Embodiments are not limited to this example.

As shown in FIG. 2, the gain control circuit 12 of the receiver 10 includes an absolute value calculation unit 121, an integration processing unit 122, a difference calculation unit 123, a reference value generation unit 124, an attack control unit 126, a release control unit 127, a switching unit 125, and a voltage gain conversion unit 128. The pulse detection circuit 13 includes a pulse noise detection circuit 131. The pulse noise removal circuit 14 includes a delay unit 141 and an attenuation unit 142.

The receiver 10 receives a reception signal and the reception signal is converted into an IF signal in an IF band. The obtained IF signal is branched into an IF signal that is processed as a main signal and a monitoring IF signal that is used to detect whether or not a pulse noise is contained in the IF signal. The received-signal amplification circuit 11 amplifies the monitoring IF signal branched from the IF signal.

The absolute value calculation unit 121 converts an amplitude of the monitoring IF signal into an absolute value by using, for example, a rectification circuit. The integration processing unit 122 integrates (i.e., smooths) the absolute value of the amplitude of the monitoring IF signal and outputs a signal value corresponding to the amplitude of the IF signal to the difference calculation unit 123 and the attack control unit 126. The difference calculation unit 123 calculates a difference between the signal value output from the integration processing unit 122 and a reference value generated by the reference value generation unit 124. The reference value may also be referred to as a reference level.

When the difference is larger than zero, i.e., when the signal value is larger than the reference value, the switching unit 125 connects a terminal 1 to a terminal 3 in order to select an attack operation performed by the attack control unit 126. As a result, an output voltage of the attack control unit 126 is selected as an AGC voltage.

Further, when the difference is equal to or smaller than zero, i.e., when the signal value is equal to or smaller than the reference value, the switching unit 125 connects the terminal 1 to a terminal 2 in order to select a release operation performed by the release control unit 127. As a result, an output voltage of the release control unit 127 is selected as the AGC voltage. The AGC voltage corresponds to the gain setting value that is set in the received-signal amplification circuit 11.

The pulse noise detection circuit 131 of the pulse detection circuit 13 monitors changes in the AGC voltage of the IF-AGC and detects whether or not a change that meets a predetermined condition has occurred. When it is detected that the predetermined change has occurred in the AGC voltage, the pulse noise detection circuit 131 detects that a pulse noise is contained in the monitoring IF signal. Further, when it is not detected that the predetermined change has occurred in the AGC voltage, the pulse noise detection circuit 131 detects that no pulse noise is contained in the monitoring IF signal. It is obvious that when a pulse noise is contained in the monitoring IF signal, a pulse noise is also contained in the original IF signal (i.e., the IF signal from which the monitoring IF signal was branched), whereas when no pulse noise is contained in the monitoring IF signal, no pulse noise is contained in the original IF signal.

Specifically, the pulse noise detection circuit 131 detects that a pulse noise is contained in each of the monitoring IF signal and the IF signal when the below-shown Expressions (1) and (2) are satisfied.

[Expression 1]

$$Tk < Tkt \qquad (1)$$

where Tk is an attack period and Tkt is an attack period threshold.

When the signal value is larger than the reference value, the gain control circuit 12 performs an attack operation for decreasing the AGC voltage and thereby decreasing the gain of the received-signal amplification circuit 11 in order to make the amplitude of the IF signal fall within the predetermined range. The state where the signal value is larger than the reference value is also referred to as a state where the difference between the signal value and the reference value is larger than zero. The attack period Tk is a period during which the difference between the signal value and the reference value is larger than zero. Further, the attack period Tk may be a period during which the attack control section 126 performs the attack operation. The attack control unit 126 includes an attack period calculation counter 1261. The attack period calculation counter 1261 measures the attack period Tk by performing a counting process for each sample during the attack period Tk.

The attack period threshold Tkt has a predetermined value. The attack period threshold may also be referred to as a predetermined period threshold.

[Expression 2]

$$(Vg/Tk) > Vgt \qquad (2)$$

where Vg is a voltage change total quantity and Vgt is an average voltage variation threshold.

The voltage change total quantity Vg is the total quantity of changes in the AGC voltage during the attack period Tk. The average voltage variation threshold Vgt is a threshold for an average variation the AGC voltage. The term (Voltage change total quantity Vg/Attack period Tk) is an average variation of the AGC voltage per unit time when an attack operation is performed for a pulse noise. The average variation of the AGC voltage per unit time may also be referred to as a variation of the AGC voltage (or a quantity of change in the AGC voltage). The average voltage variation threshold may also be referred to as a predetermined variation threshold.

When the attack period Tk is shorter than the attack period threshold Tkt and the total quantity of changes in the AGC voltage during the attack period Tk is larger than the average voltage variation threshold Vgt, the pulse noise detection circuit 131 detects that a pulse noise is contained in the monitoring IF signal. Further, in this case, the pulse noise detection circuit 131 detects that a pulse noise is also contained in the IF signal. When the pulse noise detection circuit 131 detects that a pulse noise is contained in the IF signal, it sends a blanking signal to the pulse noise removal circuit 14.

The pulse noise removal circuit 14 attenuates, when it is detected that a pulse noise is contained in the IF signal, the amplitude of the IF signal by a predetermined attenuation amount Da only for a blanking period Tb that starts upon the occurrence of the pulse noise based on the blanking signal sent from the pulse noise detection circuit 131. Specifically, the pulse noise removal circuit 14 includes an attenuation unit 142, controls the attenuation amount of the attenuation unit 142 based on the blanking signal, and attenuates the amplitude of the IF signal by the predetermined attenuation amount Da. The attenuation unit 142 is, for example, a variable amplifier or a variable attenuator.

The detection as to whether or not a pulse noise is contained in the IF signal performed by the pulse noise detection circuit 131 is performed when the pulse noise has already passed. Therefore, even if the pulse noise removal circuit 14 attempts to attenuate the IF signal in a period during which the pulse noise is contained in the IF signal, the timing is inappropriate.

Therefore, the pulse noise removal circuit 14 of the receiver 10 according to the embodiment includes a delay unit 141 that delays pulse noises contained in the IF signal. The pulse noise removal circuit 14 delays a pulse noise by using the delay unit 141 and thereby synchronizes the start timing of the pulse noise with the start timing of a blanking period Tb, and attenuates the amplitude of the IF signal. That is, the pulse noise removal circuit 14 delays the pulse noise and thereby synchronizes the pulse noise with the blanking signal, and attenuates the amplitude of the IF signal. Attenuating an amplitude of a pulse noise is referred to as blanking.

The blanking period Tb may be set to a predetermined value in a range of, for example, no shorter than 0.025 milliseconds and no longer than 10 milliseconds. Further, the predetermined attenuation amount Da may be set to a predetermined value in a range of, for example, no smaller than −100 dB and no larger than −5 dB. Further, when a signal is sharply attenuated, a corresponding voice (or sound) may be heard as an unnatural voice (or sound). In order to prevent the corresponding voice from being heard as an unnatural voice (or sound), the blanking signal is subjected to a process in which a roll-off filter is applied.

The delay amount of the IF signal for synchronizing it with the blanking signal, i.e., the delay amount in the delay unit 141 is determined from the blanking period Tb, a delay amount of the roll-off filter, and a bandwidth of a later-described band limit filter.

The receiver 10 may include a plurality of band limiting filters (not shown) to limit a band of an IF signal. A band limiting filter may be exclusively selected from the plurality of band limiting filters and is selected according to the radio wave format and/or the bandwidth in which the receiver 10 performs receiving. A delay amount and a pulse width (i.e., a time width) of a pulse noise change according to the type of the band limiting filter as the pulse noise passes through the band limiting filter. For example, the time width of a pulse noise becomes longer, compared to when the pulse noise does not pass through a band limiting filter. Further, when a pulse noise passes through a band limiting filter having a bandwidth narrower than a predetermined bandwidth, its time width becomes longer, compared to when the pulse noise passes through a band limiting filter having the predetermined bandwidth. That is, the narrower the bandwidth of the band limiting filter is, the longer the time width of the pulse noise that has passed through the band limiting filter becomes.

Therefore, the pulse noise removal circuit 14 of the receiver 10 may change the blanking period Tb according to the type of the used band limiting filter. Further, the pulse noise removal circuit 14 may change the blanking period Tb according to the bandwidth of the used band limit filter.

An amplitude of a pulse noise becomes smaller as the pulse noise passes through a band limiting filter, compared to when the pulse width does not pass through the band limiting filter. Further, when a pulse noise passes through a band limiting filter having a bandwidth narrower than a predetermined bandwidth, its amplitude becomes smaller, compared to when the pulse noise passes through a band limiting filter having the predetermined bandwidth. That is, the narrower the bandwidth of the band limiting filter is, the smaller the amplitude of the pulse noise that has passed through the band limiting filter becomes.

Therefore, the pulse noise removal circuit 14 of the receiver 10 may change the predetermined attenuation amount Da according to the type of the used band limiting filter. Further, the pulse noise removal circuit 14 may change the predetermined attenuation amount Da according to the bandwidth of the used band limitation filter.

The gain control circuit 12 further includes a voltage gain conversion unit 128 that converts the AGC voltage output from the attack control unit 126 or the release control unit 127 into a gain control signal for controlling the gain of the received-signal amplification circuit 11. The voltage gain conversion unit 128 outputs the obtained gain control signal to the received-signal amplification circuit 11. The received-signal amplification circuit 11 controls the gain by using the gain control signal.

Next, an operation performed by the receiver according to the embodiment is described.

Figure 3:
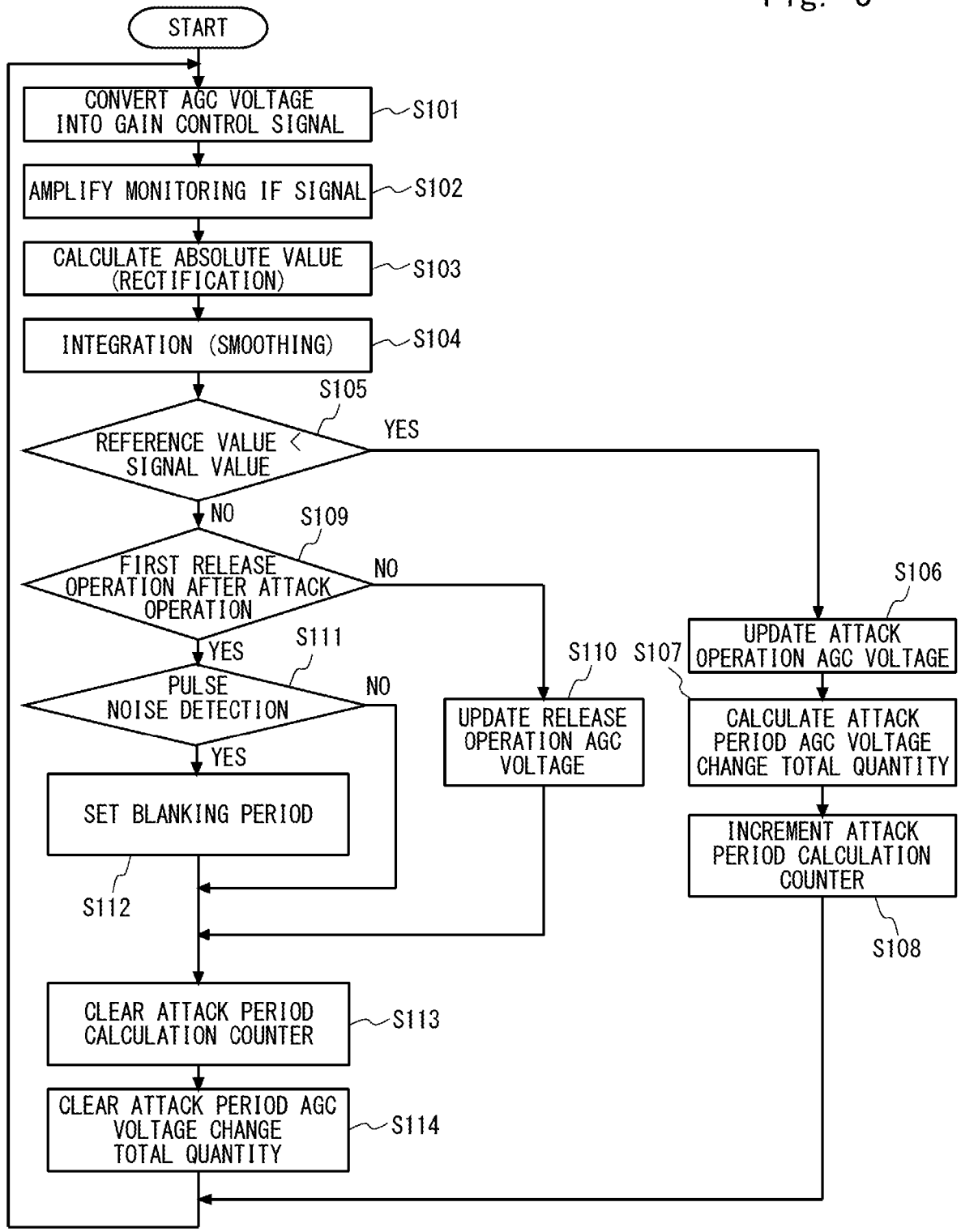
FIG. 3 is a flowchart showing an example of an operation performed by a receiver according to an embodiment.

FIG. 3 is a flowchart showing an example of an operation performed by the receiver according to the embodiment.

As shown in FIG. 3, the voltage gain conversion unit 128 converts an AGC voltage into a gain control signal in order to set the gain of the received-signal amplification circuit 11 (step S101). The voltage gain conversion unit 128 outputs the obtained gain control signal to the received-signal amplification circuit 11.

The received-signal amplification circuit 11 amplifies a monitoring IF signal based on the gain control signal (step S102).

The absolute value calculation unit 121 calculates (i.e., rectifies) an absolute value of an amplitude of the monitoring IF signal (step S103).

The integration processing unit 122 integrates (i.e., smooths) the absolute value of the amplitude of the monitoring IF signal, and outputs a signal value thereof (step S104).

The difference calculation unit 123 detects whether or not the signal value is larger than a reference value (step S105).

When the signal value is larger than the reference value (step S105: Yes), the switching unit 125 connects a terminal 1 to a terminal 3 in order to select an attack operation performed by the attack control unit 126. The attack control unit 126 performs the attack operation (step S106). An AGC voltage update unit 1262 updates the AGC voltage according to the attack operation (step S106).

The attack control unit 126 cumulatively added the AGC voltage value during the attack period Tk and thereby calculates the attack period AGC voltage change total quantity (step S107).

The attack control unit 126 increments the attack period calculation counter 1261 to determine the attack time Tk (step S108).

When the signal value is equal to or smaller than the reference value (step S105: No), the switching unit 125 connects the terminal 1 to a terminal 2 in order to select a release operation performed by the release control unit 127. The release control unit 127 checks whether or not the current release operation is the first release operation after the attack operation (step S109).

When the current release operation is not the first release operation after the attack operation (step S109: No), an AGC voltage update unit 1272 of the release control unit 127 updates the AGC voltage of the release operation (step S110).

When the current release operation is the first release operation after the attack operation (step S109: Yes), the AGC voltage update unit 1272 of the release control unit 127 instructs the pulse noise detection circuit 131 to detect whether or not a pulse noise is contained in the IF signal (step S111). When the pulse noise detection circuit 131 detects that a pulse noise is contained in the monitoring IF signal, it detects that a pulse noise is contained in the original IF signal (i.e., the IF signal from which the monitoring IF signal was branched). Further, when the pulse noise detection circuit 131 detects that no pulse noise is contained in the monitoring IF signal, it detects that no pulse noise is contained in the original IF signal. The pulse noise detection circuit 131 outputs a detection result to the pulse noise removal circuit 14.

When the pulse noise detection circuit 131 detects that a pulse noise is contained in the IF signal (step S111: Yes), the pulse noise detection circuit 131 sets a blanking period Tb in the pulse noise removal circuit 14 (step S112). The delay unit 141 of the pulse noise removal circuit 14 delays the IF signal by a predetermined time. The attenuation unit 142 of the pulse noise removal circuit 14 attenuates the amplitude of the delayed IF signal by a predetermined attenuation amount Da by using a variable amplifier or a variable attenuator.

When the step S111 is "No" after the step S110, or after the step S112, the attack control unit 126 clears (i.e., initializes) the attack period calculation counter 1261 (step S113).

The attack control unit 126 clears the attack period AGC voltage change total quantity (step S114).

After the step S114, the receiver 10 returns to the step S101.

Next, effects of the receiver according to the embodiment are described.

Figure 4A:
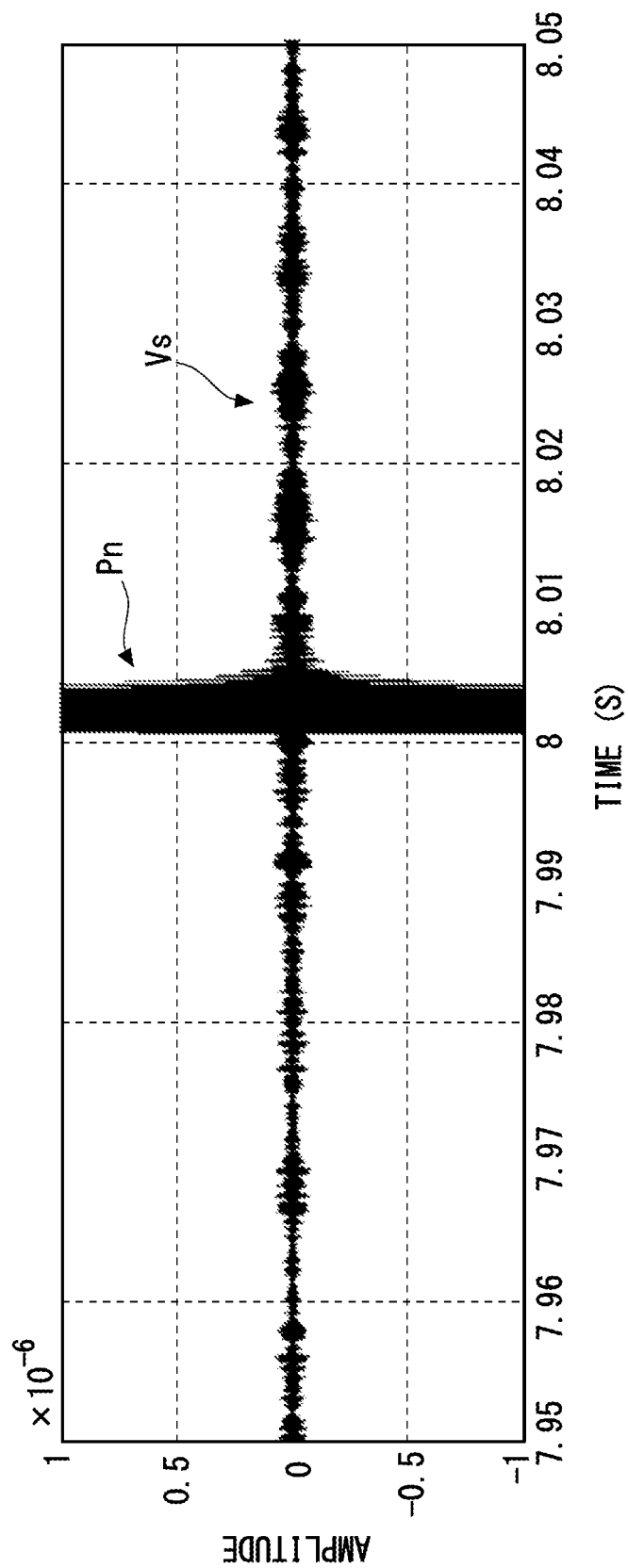
FIG. 4A is a graph showing an example of an IF signal input to a pulse noise removal circuit.

FIG. 4A is a graph showing an example of an IF signal input to the pulse noise removal circuit.

In FIG. 4A, a horizontal axis represents time and a vertical axis represents amplitudes. In FIG. 4A, Vs indicates a voice signal (or a sound signal) and Pn indicates a pulse noise.

Figure 4B:
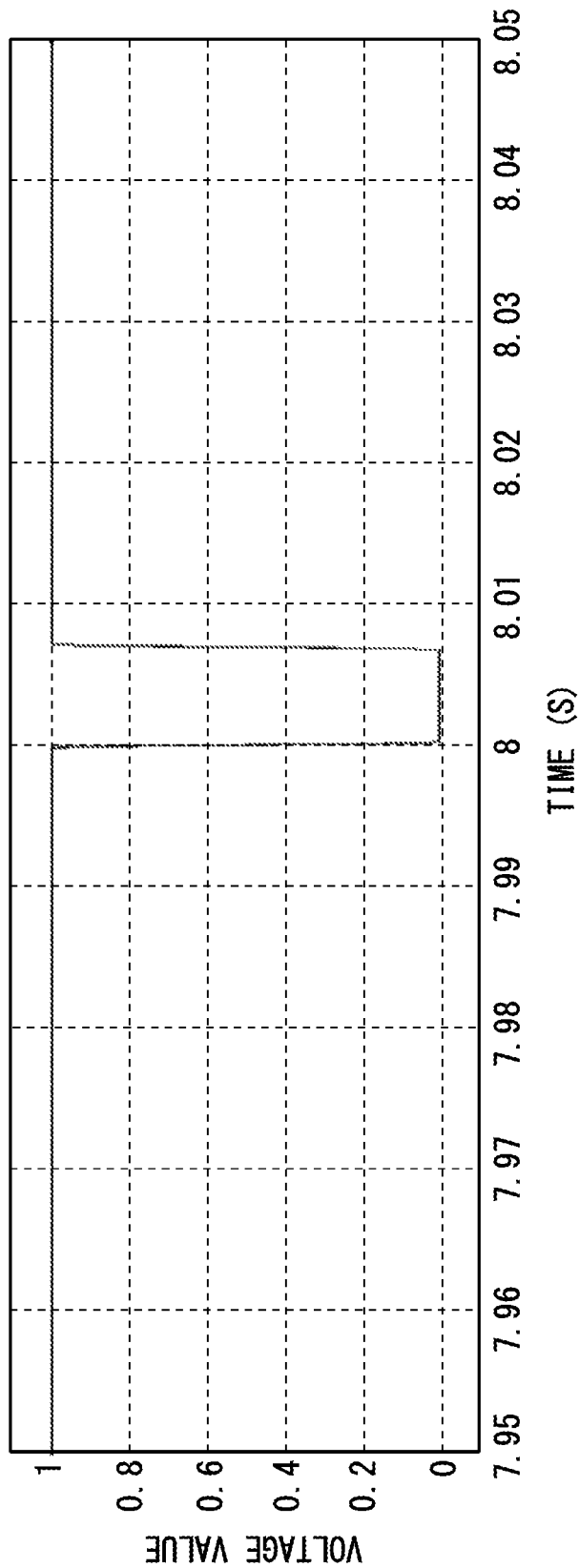
FIG. 4B is a graph showing an example of a blanking signal.

FIG. 4B is a graph showing an example of a blanking signal.

In FIG. 4B, a horizontal axis represents time and a vertical axis represents voltage values for attenuation quantity setting.

Figure 4C:
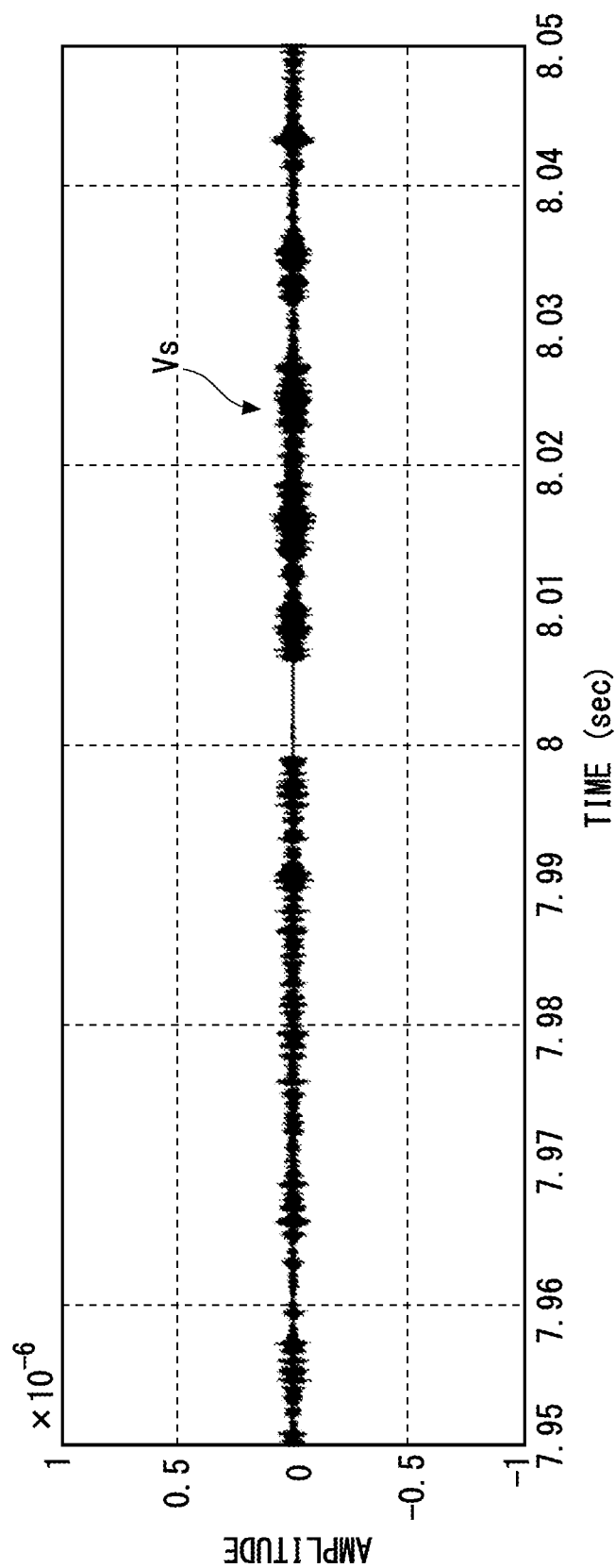
FIG. 4C is a graph showing an example of an IF signal output from a pulse noise removal circuit.

FIG. 4C is a graph showing an example of an IF signal output from the pulse noise removal circuit.

In FIG. 4C, a horizontal axis represents time and a vertical axis represents amplitudes.

FIGS. 4A to 4C show graphs in the case where the bandwidth is 2,700 Hz (hertz).

As shown in FIG. 4A, the IF signal contains pulse noises indicated by Pn in addition to voice signals indicated by Vs.

When an IF signal including a voice signal (or a sound signal) indicated by Vs shown in FIG. 4A and a pulse noise indicated by Pn shown in FIG. 4A is input to the receiver 10, a blanking signal synchronized with the pulse noise indicated by Pn in FIG. 4A is input to the pulse noise removal circuit 14 as shown in FIG. 4B. In the pulse noise removal circuit 14, when a voltage of the blanking signal is high, the attenuation amount of the attenuation unit 142 is set to a low value, whereas when the voltage of the blanking signal is low, the attenuation amount of the attenuation unit 142 is set to a high value.

When it is detected that a pulse noise is contained in the IF signal, the receiver 10 suppresses and removes the pulse noise based on the blanking signal synchronized with the pulse noise shown in FIG. 4B and outputs an IF signal shown in FIG. 4C. It can be seen that, as compared to the IF input signal input to the pulse noise removal circuit 14, the pulse noise is removed from the IF signal output from the pulse noise removal circuit 14.

The receiver 10 according to the embodiment includes the pulse noise detection circuit 131 that detects whether or not a pulse noise is contained in an IF signal, and the pulse noise removal circuit 14 that attenuates the pulse noise. In this way, pulse noises are efficiently suppressed and removed in a receiving environment in which there are pulse noises. Therefore, it is possible to preventing (or minimizing) a deterioration of intelligibility of a reception signal.

Consequently, in the embodiment, it is possible to provide a receiver and a program capable of, when they have received a pulse noise together with a reception signal, improving quality of the reception signal.

Note that the embodiment has been described by using an example case in which the AGC voltage is used to control the gain of the received-signal amplification circuit 11. However, the present disclosure is not limited to this example.

Note that the embodiment is not limited to the above-described embodiments and may be modified as appropriate without departing from the spirit of the present disclosure.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A receiver comprising:
   a received-signal amplification circuit configured to amplify a monitoring received signal branched from a received signal;
   a gain control circuit configured to rectify the amplified received signal to calculate an absolute value, smooth the rectified the received signal into a signal value, calculate a difference value between the signal value and a predetermined reference value, and set a gain setting value for an Automatic Gain Control (AGC) operation in the received-signal amplification circuit. based on the difference value, the AGC operation being an operation for making an amplitude of an amplified monitoring received signal fall within a predetermined range;
   a pulse detection circuit configured to detect that a pulse noise is contained in the received signal when a period that is required for a change in the gain setting value in a period during which the signal value is larger than the predetermined reference value is shorter than a predetermined period threshold and a quantity of the change is larger than a predetermined variation threshold; and
   a pulse noise removal circuit configured to attenuate the received signal by a predetermined attenuation amount for a predetermined period when it is detected that the pulse noise is contained in the received signal.

2. The receiver according to claim 1, wherein
the pulse noise removal circuit comprises an attenuation circuit configured to attenuate the pulse noise, and a delay circuit configured to delay the pulse noise,
when the pulse detection circuit detects that the pulse noise is contained in the received signal, it sets a blanking period during which the attenuation circuit attenuates the pulse noise by the predetermined attenuation amount; and
the delay circuit delays the pulse noise in the received signal and synchronizes it with the blanking period.

3. The receiver according to claim 2, further comprising a plurality of filters configured to be exclusively used and a plurality of band limiting filters, wherein
the pulse detection circuit sets the blanking period based on a type of the filter or the band limiting filter and detects the pulse noise.

4. A non-transitory computer readable medium storing a program for causing a computer to:
amplify a monitoring received signal branched from a received signal;
rectify the amplified received signal to calculate an absolute value;
smooth the rectified the received signal into a signal value;
calculate a difference value between the signal value and a predetermined reference value; and
set a gain setting value in a received-signal amplification circuit, based on the difference value, so that an amplitude of an amplification of the monitoring received signal falls within a predetermined range;
detect that a pulse noise is contained in the received signal when a period that is required for a change in the gain setting value in a period during which the signal value is larger than the predetermined reference value is shorter than a predetermined period threshold and a quantity of the change is larger than a predetermined variation threshold; and
attenuate the received signal by a predetermined attenuation amount only for a predetermined period when it is detected that the pulse noise is contained in the received signal.

* * * * *